United States Patent
Kobayashi et al.

(10) Patent No.: US 12,074,545 B2
(45) Date of Patent: Aug. 27, 2024

(54) SEMICONDUCTOR DEVICE AND MOTOR DRIVE SYSTEM

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazuya Kobayashi, Yokohama Kanagawa (JP); Hiroshi Odawara, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/901,318

(22) Filed: Sep. 1, 2022

(65) Prior Publication Data
US 2023/0308037 A1    Sep. 28, 2023

(30) Foreign Application Priority Data
Mar. 24, 2022    (JP) .................................. 2022-048510

(51) Int. Cl.
*G01R 31/42* (2006.01)
*H02P 23/14* (2006.01)

(52) U.S. Cl.
CPC .................................. *H02P 23/14* (2013.01)

(58) Field of Classification Search
CPC ................................ H02P 23/14; H02P 23/00
USPC ........................................ 318/474; 365/174
See application file for complete search history.

(56) References Cited

U.S. PATENT DOCUMENTS

| | | | |
|---|---|---|---|
| 7,005,916 B2 * | 2/2006 | Nakahira | H03F 3/45753 330/9 |
| 7,626,350 B2 | 12/2009 | Mori et al. | |
| 7,834,567 B2 | 11/2010 | Naya et al. | |
| 2006/0055352 A1 | 3/2006 | Mori et al. | |
| 2009/0256504 A1 | 10/2009 | Naya et al. | |
| 2014/0312818 A1 * | 10/2014 | Furuchi | H02P 6/085 318/400.29 |
| 2015/0236661 A1 * | 8/2015 | Imai | H03F 3/45475 330/260 |
| 2018/0062659 A1 * | 3/2018 | Oda | H03K 19/1776 |

FOREIGN PATENT DOCUMENTS

JP    2003-018900 A    1/2003

* cited by examiner

*Primary Examiner* — Gabriel Agared
(74) *Attorney, Agent, or Firm* — Kim & Stewart LLP (57) ABSTRACT

A semiconductor device includes first to fifth terminals, an amplification circuit including a first input end connectable to the first terminal and the third terminal, a second input end connectable to the second terminal and the fourth terminal, and an output end, and a switching circuit. The switching circuit is configured to switch between a first state in which the first input end is connected to the first terminal and insulated from the third terminal and the second input end is connected to the second terminal and insulated from the fourth terminal, and a second state in which the first input end is connected to the third terminal and insulated from the first terminal and the second input end is connected to the fourth terminal and insulated from the second terminal.

20 Claims, 7 Drawing Sheets

|  | SEL1 | SEL2 | SW1 | SW2 | SW3 | SW4 | SW5 | SW6 | SW7 | SW8 |
|---|---|---|---|---|---|---|---|---|---|---|
| FIRST STATE | L | H | ○ | ○ | × | × | × | × | × | × |
| SECOND STATE | H | L | × | × | ○ | ○ | × | × | × | × |
| THIRD STATE | H | H | × | × | × | × | ○ | ○ | × | × |
| FOURTH STATE | L | L | × | × | × | × | × | × | ○ | ○ |

SEMICONDUCTOR DEVICE AND MOTOR DRIVE SYSTEM

CROSS-REFERENCE TO RELATED APPLICATION(S)

This application is based upon and claims the benefit of priority from Japanese Patent Application No. 2022-048510, filed Mar. 24, 2022, the entire contents of which are incorporated herein by reference.

FIELD

Embodiments described herein relate generally to a semiconductor device and a motor drive system.

BACKGROUND

A semiconductor device for detecting a current is known in the art.

DETAILED DESCRIPTION

Embodiments provide a semiconductor device and a motor drive system that can reduce costs.

In general, according to one embodiment, there is provided a semiconductor device including first to fifth terminals, an amplification circuit including a first input end connectable to the first terminal and the third terminal, a second input end connectable to the second terminal and the fourth terminal, and an output end, and a switching circuit. The switching circuit is configured to switch between a first state in which the first input end is connected to the first terminal and insulated from the third terminal and the second input end is connected to the second terminal and insulated from the fourth terminal, and a second state in which the first input end is connected to the third terminal and insulated from the first terminal and the second input end is connected to the fourth terminal and insulated from the second terminal.

Hereinafter, embodiments will be described with reference to the drawings. In the description, elements having substantially the same function and configuration are designated by the same reference numerals. The embodiments indicated below illustrate the technical idea, which is not limited to the material, shape, structure, arrangement, and the like of the embodiments. Various changes may be made to the embodiments.

[1] First Embodiment

A semiconductor device according to a first embodiment will be described.

[1-1] Configuration

[1-1-1] Overall Configuration of Motor Drive System SYS Including Semiconductor Device 1

Figure 1:
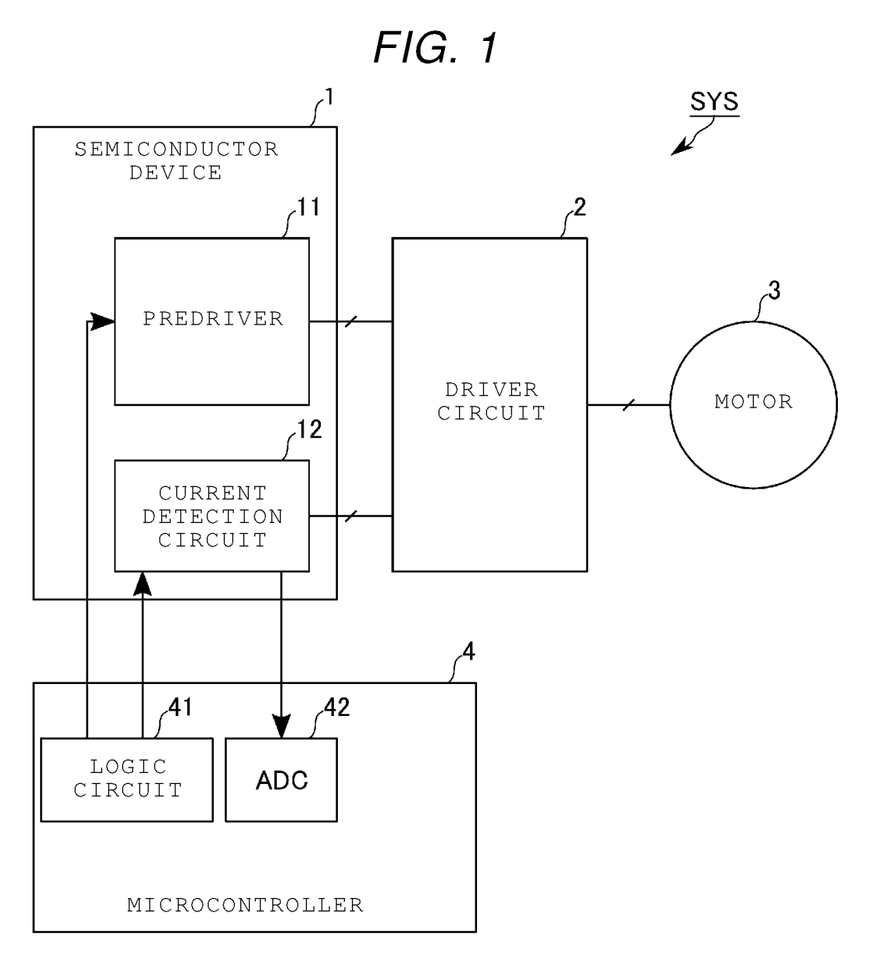
FIG. 1 is a block diagram for illustrating an example of a configuration of a motor drive system according to a first embodiment.

FIG. 1 is a block diagram for illustrating an example of a configuration of a motor drive system according to a first embodiment. The motor drive system SYS is a system that drives a power steering of a vehicle with a motor. The motor drive system SYS includes a semiconductor device 1, a driver circuit 2, a motor 3, and a microcontroller 4.

The semiconductor device 1 is an integrated circuit (IC) chip. The semiconductor device 1 includes a predriver 11 and a current detection circuit 12. The predriver 11 is a circuit that drives the driver circuit 2 based on a signal from the microcontroller 4. The current detection circuit 12 detects a current flowing through the driver circuit 2 and outputs a voltage to the microcontroller 4.

The driver circuit 2 is a drive circuit including a plurality of power semiconductors (not illustrated). The driver circuit 2 is driven by the predriver 11 to generate a drive current to drive the motor 3. The drive current is a three-phase alternating current.

The motor 3 is a three-phase AC motor. The motor 3 is driven by the driver circuit 2 and drives a load of power steering (not illustrated).

The microcontroller 4 is an IC chip. The microcontroller 4 controls the semiconductor device 1. The microcontroller 4 includes a logic circuit 41 and an AD converter (ADC) 42. The logic circuit 41 generates a signal required for controlling the semiconductor device 1. The logic circuit 41 transmits a control signal to the predriver 11 and the current detection circuit 12. The ADC 42 measures an input voltage and converts the input voltage into a digital value.

[1-1-2] Configuration of Driver Circuit 2

Figure 2:
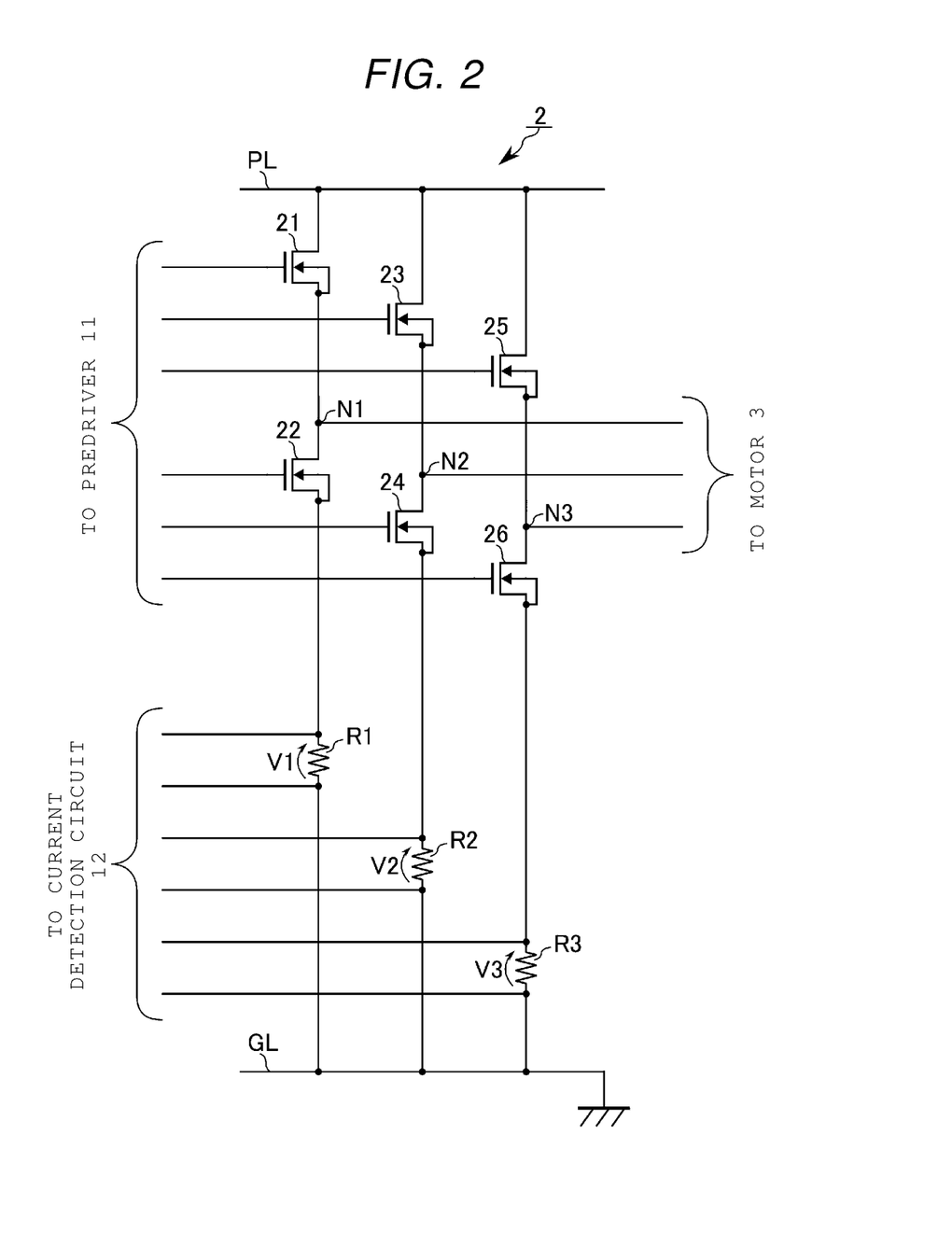
FIG. 2 is a circuit diagram illustrating a configuration example of a driver circuit according to the first embodiment.

FIG. 2 is a circuit diagram illustrating a configuration example of the driver circuit according to the first embodiment. The driver circuit 2 includes power supply lines PL and GL, transistors 21 to 26, and resistors R1 to R3.

A power supply voltage is applied to the power supply line PL. The power supply line GL is grounded.

A drain of the transistor 21 is connected to the power supply line PL. A source of the transistor 21 is connected to a node N1. A drain of the transistor 22 is connected to the node N1. A source of the transistor 22 is connected to a first end of a resistor R1. A second end of the resistor R1 is connected to the power supply line GL.

A drain of the transistor 23 is connected to the power supply line PL. A source of the transistor 23 is connected to a node N2. A drain of the transistor 24 is connected to the node N2. A source of the transistor 24 is connected to a first end of a resistor R2. A second end of the resistor R2 is connected to the power supply line GL.

A drain of the transistor 25 is connected to the power supply line PL. A source of the transistor 25 is connected to a node N3. A drain of the transistor 26 is connected to the node N3. A source of the transistor 26 is connected to a first end of a resistor R3. A second end of the resistor R3 is connected to the power supply line GL.

Gates of the transistors 21 to 26 are independently connected to the predriver 11. The drive current is generated by individually controlling the transistors 21 to 26 to be turned on and off by the predriver 11. The first end and second end of each of the resistors R1 to R3 are independently connected to the current detection circuit 12. Each of the nodes N1, N2, and N3 is connected to the motor 3. Each of the nodes N1, N2, and N3 is an output node of the driver circuit 2.

A voltage generated across the resistor R1 is voltage V1. A voltage generated across the resistor R2 is voltage V2. A voltage generated across the resistor R3 is voltage V3.

Each of the resistors R1 to R3 is a resistor for current detection. Resistance values of the resistors R1 to R3 are known to the microcontroller 4. The connections between the first end and second end of each of the resistors R1 to R3 and the current detection circuit 12 are independently wired as described above. By wiring in this way, the influence of a parasitic resistance component of the wiring is prevented. Details of the connections between the resistors R1 to R3 and the current detection circuit 12 will be described later.

[1-1-3] Configuration of Current Detection Circuit 12

Figure 3:
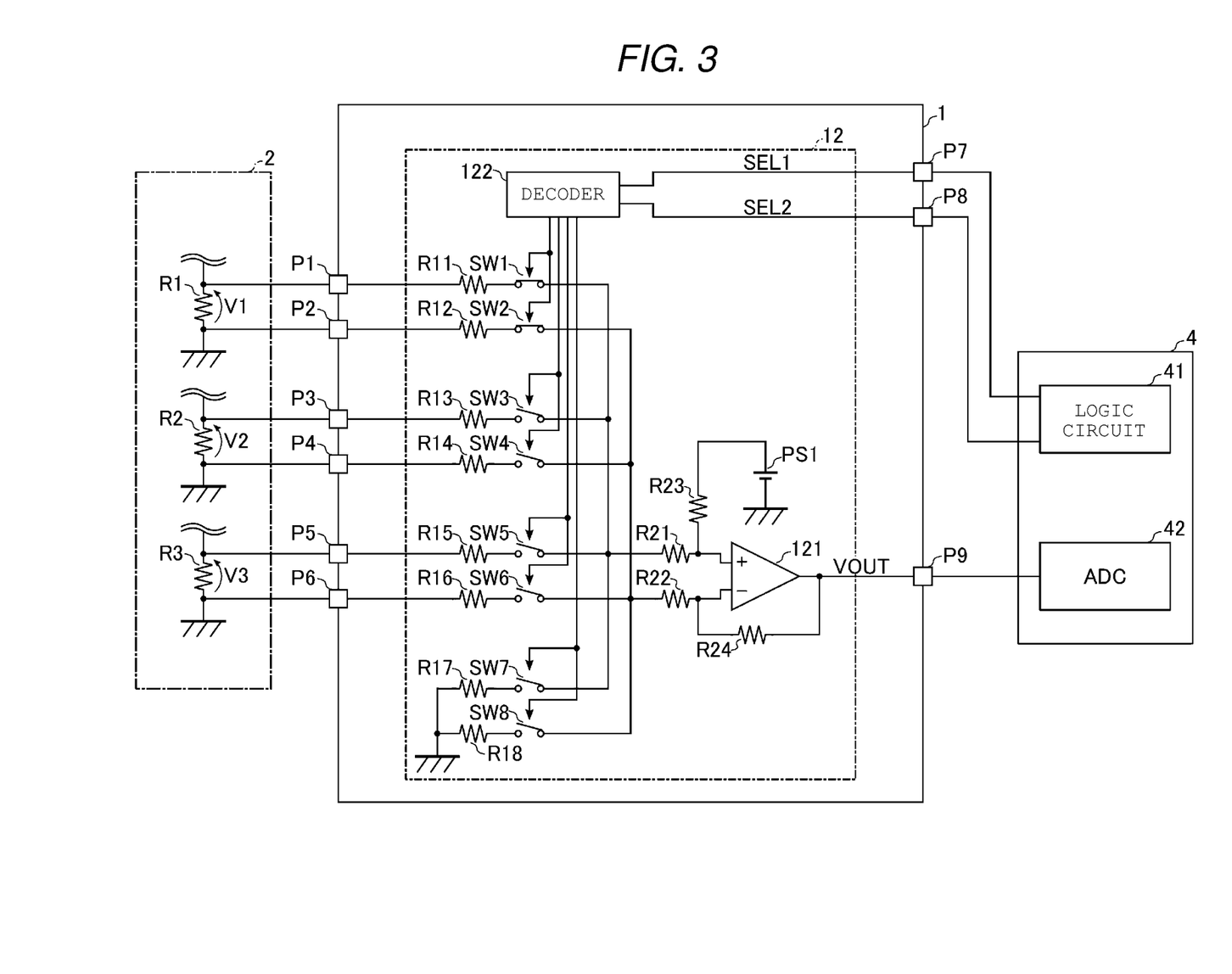
FIG. 3 is a circuit diagram illustrating a current detection circuit of a semiconductor device, a part of the driver circuit, and a microcontroller according to the first embodiment.

FIG. 3 is a circuit diagram illustrating the current detection circuit of the semiconductor device, a part of the driver circuit, and the microcontroller according to the first embodiment.

The semiconductor device 1 further includes terminals P1 to P9. The terminals P1 to P9 are configured to electrically connect the inside of the semiconductor device 1 to the outside.

The terminal P1 is connected to the first end of the resistor R1. The terminal P2 is connected to the second end of the resistor R1. The terminal P3 is connected to the first end of the resistor R2. The terminal P4 is connected to the second end of the resistor R2. The terminal P5 is connected to the first end of the resistor R3. The terminal P6 is connected to the second end of the resistor R3. Each of the terminals P7 and P8 is connected to the logic circuit 41. The terminal P9 is connected to the ADC 42.

The current detection circuit 12 includes an operational amplifier 121, a decoder 122, resistors R11 to R18, resistors R21 to R24, switches SW1 to SW8, and a voltage source PS1.

The operational amplifier 121 is an operational amplifier that amplifies and outputs an input signal. The operational amplifier 121 is provided with a non-inverting input end, an inverting input end, and an output end. The voltage source PS1 is a constant voltage source. A voltage output by the voltage source PS1 is a voltage Vref. The voltage Vref is a reference voltage that determines an operating point of the operational amplifier 121. The voltage Vref is, for example, a DC voltage having a magnitude of half the power supply voltage (not illustrated) of the operational amplifier 121.

A first end of the resistor R11 is connected to the terminal P1. The switch SW1 electrically connects a second end of the resistor R11 and a first end of the resistor R21 when the switch SW1 is in a connected state and electrically insulates them when the switch SW1 is in a non-connected state. A first end of the resistor R12 is connected to the terminal P2. The switch SW2 electrically connects a second end of the resistor R12 and a first end of the resistor R22 when the switch SW2 is in the connected state and electrically insulates them when the switch SW2 is in the non-connected state. A first end of the resistor R13 is connected to the terminal P3. The switch SW3 electrically connects a second end of the resistor R13 and the first end of the resistor R21 when the switch SW3 is in the connected state and electrically insulates them when the switch SW3 is in the non-connected state. A first end of the resistor R14 is connected to the terminal P4. The switch SW4 electrically connects a second end of the resistor R14 and the first end of the resistor R22 when the switch SW4 is in the connected state and electrically insulates them when the switch SW4 is in the non-connected state. A first end of the resistor R15 is connected to the terminal P5. The switch SW5 electrically connects a second end of the resistor R15 and the first end of the resistor R21 when the switch SW5 is in the connected state and electrically insulates them when the switch SW5 is in the non-connected state. A first end of the resistor R16 is connected to the terminal P6. The switch SW6 electrically connects a second end of the resistor R16 and the first end of the resistor R22 when the switch SW6 is in the connected state and electrically insulates them when the switch SW6 is in the non-connected state. A first end of resistor R17 is grounded. The switch SW7 electrically connects a second end of the resistor R17 and the first end of the resistor R21 when the switch SW7 is in the connected state and electrically insulates them when the switch SW7 is in the non-connected state. A first end of the resistor R18 is grounded. The switch SW8 electrically connects a second end of the resistor R18 and the first end of the resistor R22 when the switch SW8 is in the connected state and electrically insulates them when the switch SW8 is in the non-connected state.

A second end of the resistor R21 is connected to the non-inverting input end of the operational amplifier 121. A second end of the resistor R22 is connected to the inverting input end of the operational amplifier 121. A first end of the resistor R23 is connected to the non-inverting input end of the operational amplifier 121. A second end of the resistor R23 is connected to a positive output end of the voltage source PS1. A negative output end of the voltage source PS1 is grounded. A first end of the resistor R24 is connected to the inverting input end of the operational amplifier 121. A second end of the resistor R24 is connected to the output end of the operational amplifier 121. The output end of the operational amplifier 121 is connected to the terminal P9. A signal output from the output end of the operational amplifier 121 is a signal VOUT.

The decoder 122 puts each of the switches SW1 to SW8 in the connected state or the non-connected state based on a received signal. The decoder 122 receives a signal from the logic circuit 41 via the terminals P7 and P8. Specifically, the decoder 122 receives a signal SEL1 via the terminal P7. The decoder 122 receives a signal SEL2 via the terminal P8. Each of the signals SEL1 and SEL2 is a signal containing information of one bit. That is, a total of 2 bits of information is transmitted by the signal SEL1 and the signal SEL2. The decoder 122 controls each of the switches SW1 to SW8 according to the received signals SEL1 and SEL2.

[1-2] Operation

Figure 4:
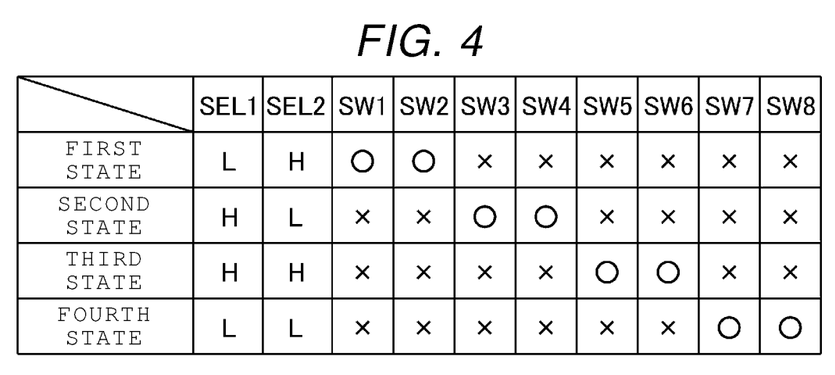
FIG. 4 is a table illustrating an operation of a decoder according to the first embodiment.

FIG. 4 is a table illustrating the operation of the decoder according to the first embodiment. FIG. 4 illustrates whether each of the signals SEL1 and SEL2 is at an "H" level or an "L" level. In FIG. 4, the connected state is indicated by an "O" mark and the non-connected state is indicated by an "X" mark for each of the switches SW1 to SW8.

The decoder 122 controls the switches SW1 to SW8 in four states from a first state to a fourth state according to the signals SEL1 and SEL2.

When the signal SEL1 is at the L level and the signal SEL2 is at the H level, the decoder controls the switches SW1 to SW8 to the first state. In the first state, each of the switches SW1 and SW2 becomes the connected state. In the first state, each of the switches SW3, SW4, SW5, SW6, SW7, and SW8 becomes the non-connected state. That is, in the first state, the operational amplifier 121 amplifies and outputs the voltage V1.

When the signal SEL1 is at the H level and the signal SEL2 is at the L level, the decoder controls the switches SW1 to SW8 to the second state. In the second state, each of the switches SW3 and SW4 becomes the connected state. In the second state, each of the switches SW1, SW2, SW5, SW6, SW7, and SW8 becomes the non-connected state. That is, in the second state, the operational amplifier 121 amplifies and outputs the voltage V2.

When the signal SEL1 is at the H level and the signal SEL2 is at the H level, the decoder controls the switches SW1 to SW8 to the third state. In the third state, each of the switches SW5 and SW6 becomes the connected state. In the third state, each of the switches SW1, SW2, SW3, SW4, SW7, and SW8 becomes the non-connected state. That is, in the third state, the operational amplifier 121 amplifies and outputs the voltage V3.

When the signal SEL1 is at the L level and the signal SEL2 is at the L level, the decoder controls the switches SW1 to SW8 to the fourth state. In the fourth state, each of the switches SW7 and SW8 becomes the connected state. In the fourth state, each of the switches SW1, SW2, SW3, SW4, SW5, and SW6 becomes the non-connected state. That is, in the fourth state, the operational amplifier 121 goes into a state in which its input end is grounded through a resistor. In the fourth state, an output of the operational amplifier 121 becomes a DC voltage having a magnitude obtained by adding an offset voltage Voff of the operational amplifier 121 to the voltage Vref. The offset voltage Voff is a voltage generated by an error in manufacturing the operational amplifier 121.

Figure 5:
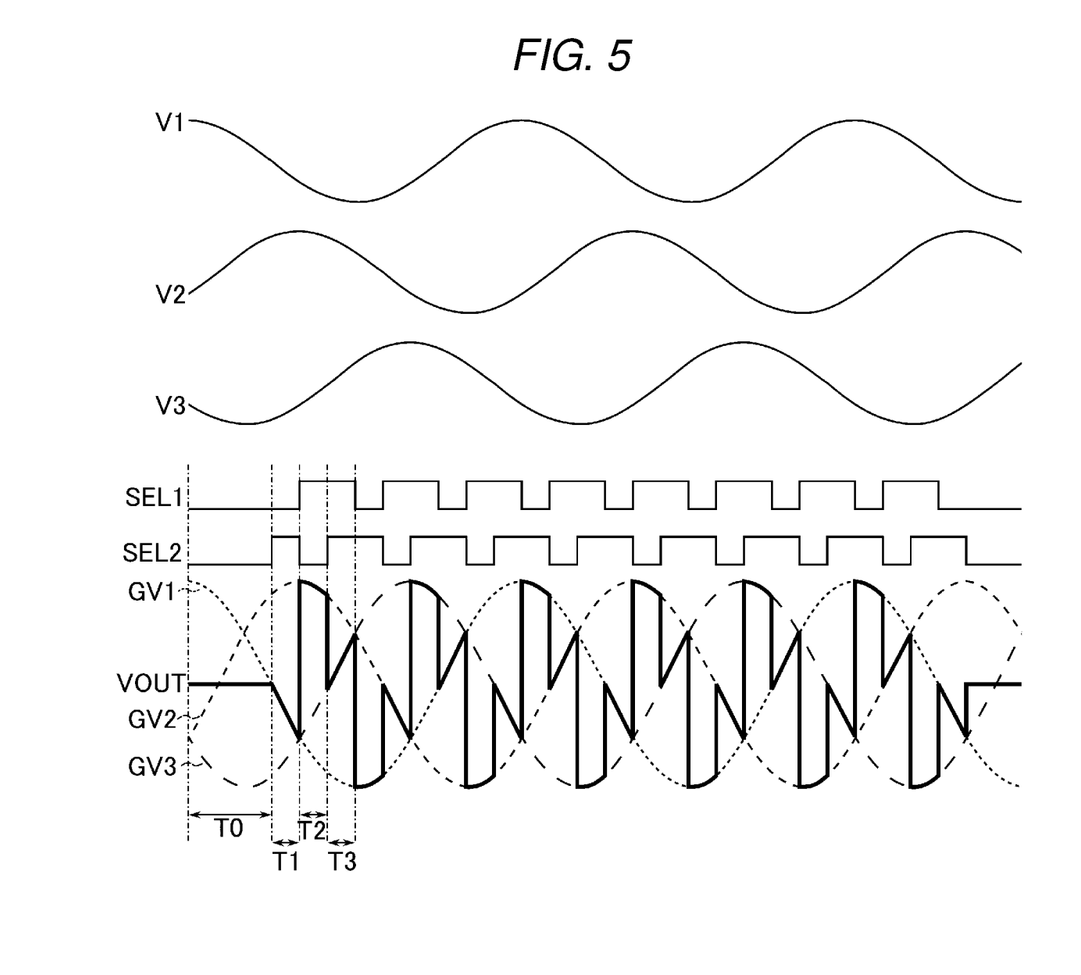
FIG. 5 is a diagram illustrating an operation of the current detection circuit according to the first embodiment.

FIG. 5 is a diagram illustrating an operation of the current detection circuit according to the first embodiment. FIG. 5 illustrates the voltages V1, V2, and V3, the signals SEL1 and SEL2, and the signal VOUT. In FIG. 5, a voltage GV1 obtained when the operational amplifier 121 amplifies the voltage V1, a voltage GV2 obtained when the operational amplifier 121 amplifies the voltage V2, and a voltage GV3 obtained when the operational amplifier 121 amplifies the voltage V3 are illustrated with broken lines and are superimposed on the signal VOUT. The densest broken line is the voltage GV1 and the coarsest broken line is the voltage GV3.

In a period T0, the signal SEL1 is at the L level and the signal SEL2 is at the L level, and thus the switches SW1 to SW8 are controlled to be in the fourth state. Therefore, in the period T0, the signal VOUT becomes the DC voltage having the magnitude obtained by adding the offset voltage Voff to the voltage Vref.

In a period T1, the signal SEL1 is at the L level and the signal SEL2 is at the H level, and thus the switches SW1 to SW8 are controlled to be in the first state. Therefore, in the period T1, the signal VOUT becomes equal to the voltage GV1.

In a period T2, the signal SEL1 is at the H level and the signal SEL2 is at the L level, and thus the switches SW1 to SW8 are controlled to be in the second state. Therefore, in the period T2, the signal VOUT becomes equal to the voltage GV2.

In a period T3, the signal SEL1 is at the H level and the signal SEL2 is at the H level, and thus the switches SW1 to SW8 are controlled to be in the third state. Therefore, in the period T3, the signal VOUT becomes equal to the voltage GV3.

After that, the signals SEL1 and SEL2 change so as to repeat the first state, the second state, and the third state, and the signal VOUT is switched so as to be equal to each of the voltage GV1, the voltage GV2, and the voltage GV3. Then, in the final period illustrated in FIG. 5, the signals SEL1 and SEL2 are in the fourth state, and the signal VOUT becomes the DC voltage having the magnitude obtained by adding the offset voltage Voff to the voltage Vref.

As described above, in the semiconductor device 1 according to the first embodiment, the voltage can be switched so that a plurality of voltages are measured with one ADC 42. In the semiconductor device 1 according to the first embodiment, the input end of the operational amplifier 121 can be grounded to output the DC voltage having the magnitude obtained by adding the offset voltage Voff to the voltage Vref.

[1-3] Effect

The semiconductor device 1 according to the embodiment includes the decoder 122, the switches SW1 to SW8, and the operational amplifier 121. The decoder 122 switches the state of the switches SW1 to SW8 based on the signals SEL1 and SEL2, and accordingly three kinds of voltages can be amplified by one operational amplifier 121.

That is, in the semiconductor device 1 according to the embodiment, one operational amplifier 121 is shared by a plurality of inputs. With this configuration, a circuit size can be reduced and an increase in a chip area can be reduced as compared to when the operational amplifier 121 is provided for each voltage to be measured. Therefore, the manufacturing cost can be reduced.

Since the circuit size is reduced, the time required for product testing can be shortened. Therefore, the testing cost can be reduced.

In the semiconductor device 1 according to the embodiment, the input end of the operational amplifier 121 can be grounded by controlling the switches SW1 to SW8 to the fourth state. The output of the operational amplifier 121 contains the offset voltage Voff. The input end of the operational amplifier 121 can be grounded and a measured value of the signal VOUT can be compared with a design value to calculate the offset voltage Voff. Specifically, the offset voltage Voff can be calculated by subtracting the magnitude of the voltage Vref from the measured value of the signal VOUT in the fourth state. Then, for example, the influence of the offset voltage Voff on the measurement result can be reduced by subtracting the calculated offset voltage Voff from the measured value of the signal VOUT obtained in the first to third states in the microcontroller 4.

[2] Second Embodiment

A configuration of the semiconductor device according to a second embodiment is different from that of the semiconductor device according to the first embodiment in the configuration of the current detection circuit. Hereinafter, regarding the semiconductor device according to the second embodiment, the difference from the first embodiment will be described.

[2-1] Configuration

[2-1-1] Configuration of Semiconductor Device 1a

Figure 6:
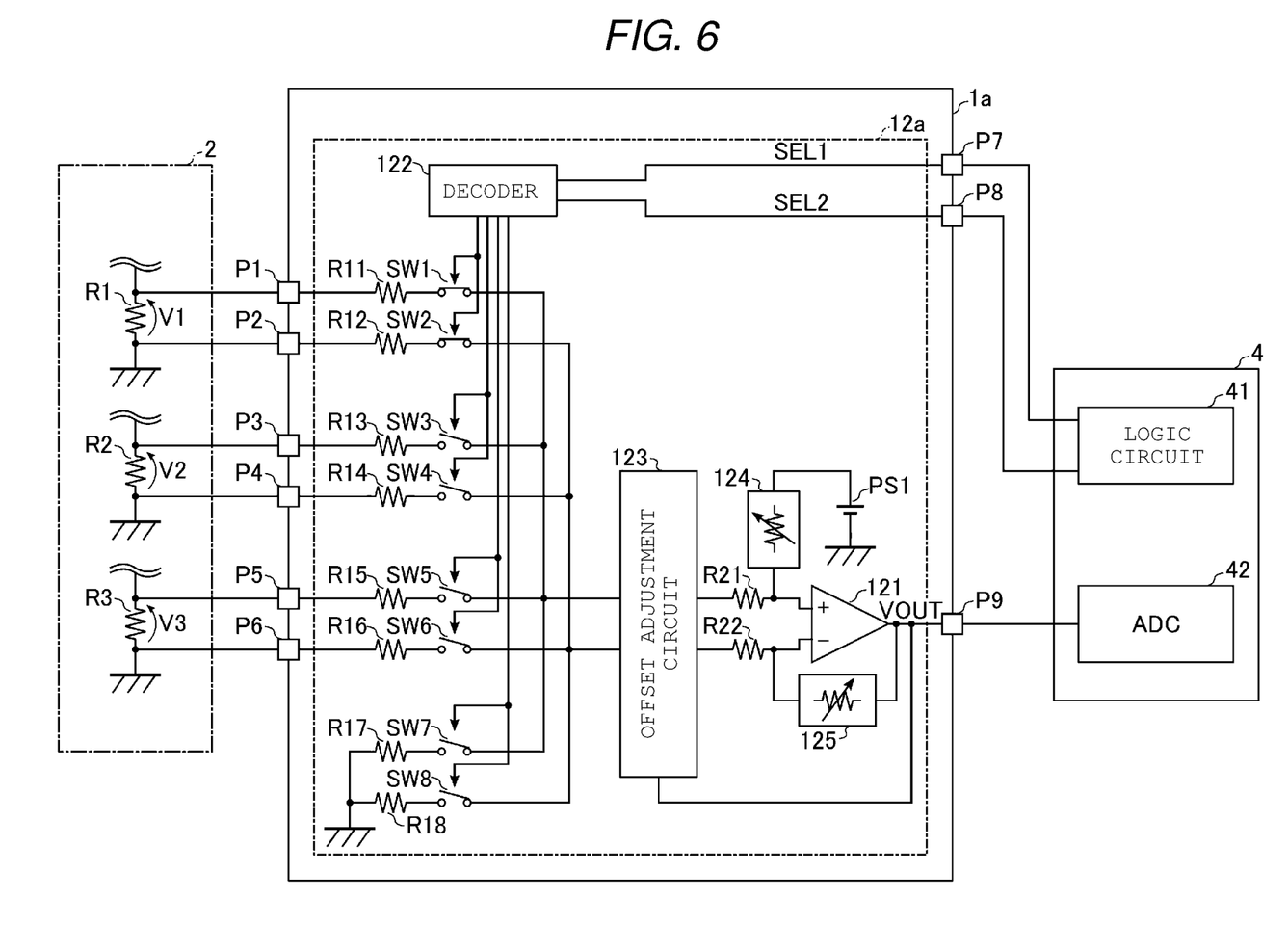
FIG. 6 is a circuit diagram illustrating a current detection circuit of a semiconductor device, a part of a driver circuit, and a microcontroller according to a second embodiment.

FIG. 6 is a circuit diagram illustrating a current detection circuit of a semiconductor device, a part of a driver circuit, and a microcontroller according to the second embodiment. The semiconductor device 1a according to the second embodiment has a configuration in which the current detection circuit 12 of the semiconductor device 1 described in the first embodiment is replaced with a current detection circuit 12a.

The current detection circuit 12a further includes an offset adjustment circuit 123 and variable resistor circuits 124 and 125 and does not include the resistors R23 and R24, with respect to the current detection circuit 12.

The offset adjustment circuit 123 has a function of adjusting the offset of the signal Vout. Specifically, the offset adjustment circuit 123 adjusts the offset of the voltage input to the operational amplifier 121 to reduce the offset of the signal Vout. The offset adjustment circuit 123 is provided between each of the switches SW1, SW3, SW5, and SW7 and the first end of the resistor R21, and is provided between each of the switches SW2, SW4, SW6, and SW8 and the first end of the resistor R22. In addition, the output of the operational amplifier 121 is connected to the offset adjustment circuit 123.

The variable resistor circuits 124 and 125 have a function of changing a resistance value to a plurality of different values. The variable resistor circuit 124 replaces the resistor R23 of the current detection circuit 12. The variable resistor circuit 125 replaces the resistor R24 of the current detection circuit 12. Other configurations of the current detection circuit 12a are the same as those of the current detection circuit 12.

In the semiconductor device 1a, the configurations other than the current detection circuit 12a are the same as those of the semiconductor device 1.

[2-2] Operation

The operation of each the offset adjustment circuit 123 and the variable resistor circuits 124 and 125 will be described in order.

The offset adjustment circuit 123 performs an offset adjustment operation when the switches SW1 to SW8 are in the fourth state. Specifically, the offset adjustment circuit 123 adjusts an offset so that the offset voltage Voff contained in the output voltage of the operational amplifier 121 approaches 0 V. When the offset adjustment operation is completed, the offset adjustment circuit 123 holds the adjustment result until the offset adjustment operation is executed again. As a result, even if the switches SW1 to SW8 change to the first state, the second state, and the third state, the offset voltage Voff is reduced.

The variable resistor circuits 124 and 125 change the resistance value by a command from the outside of the semiconductor device 1a. As a result, an amount of negative feedback of the operational amplifier 121 changes, and a gain of the current detection circuit 12a changes. In this way, the gain can be changed by the variable resistor circuits 124 and 125. The variable resistor circuits 124 and 125 may also be referred to as gain changing circuits.

[2-3] Effect

Similar to the semiconductor device 1 according to the first embodiment, the semiconductor device 1a according to the second embodiment can reduce the manufacturing cost and reduce the testing cost.

The semiconductor device 1a according to the second embodiment includes the offset adjustment circuit 123, and the variable resistor circuits 124 and 125. The offset adjustment circuit 123 and the variable resistor circuits 124 and 125 are circuits used in combination with the operational amplifier 121. Therefore, in the configuration of the second embodiment in which one operational amplifier 121 is shared by a plurality of inputs, the circuit size can be further reduced and an increase in the chip area can be reduced as compared to when the operational amplifier 121 is provided for each voltage to be measured. That is, the manufacturing cost can be further reduced.

By reducing the circuit size, the time required for product testing can be shortened. Therefore, the testing cost can also be reduced.

[3] Modifications and the Like

Figure 7:
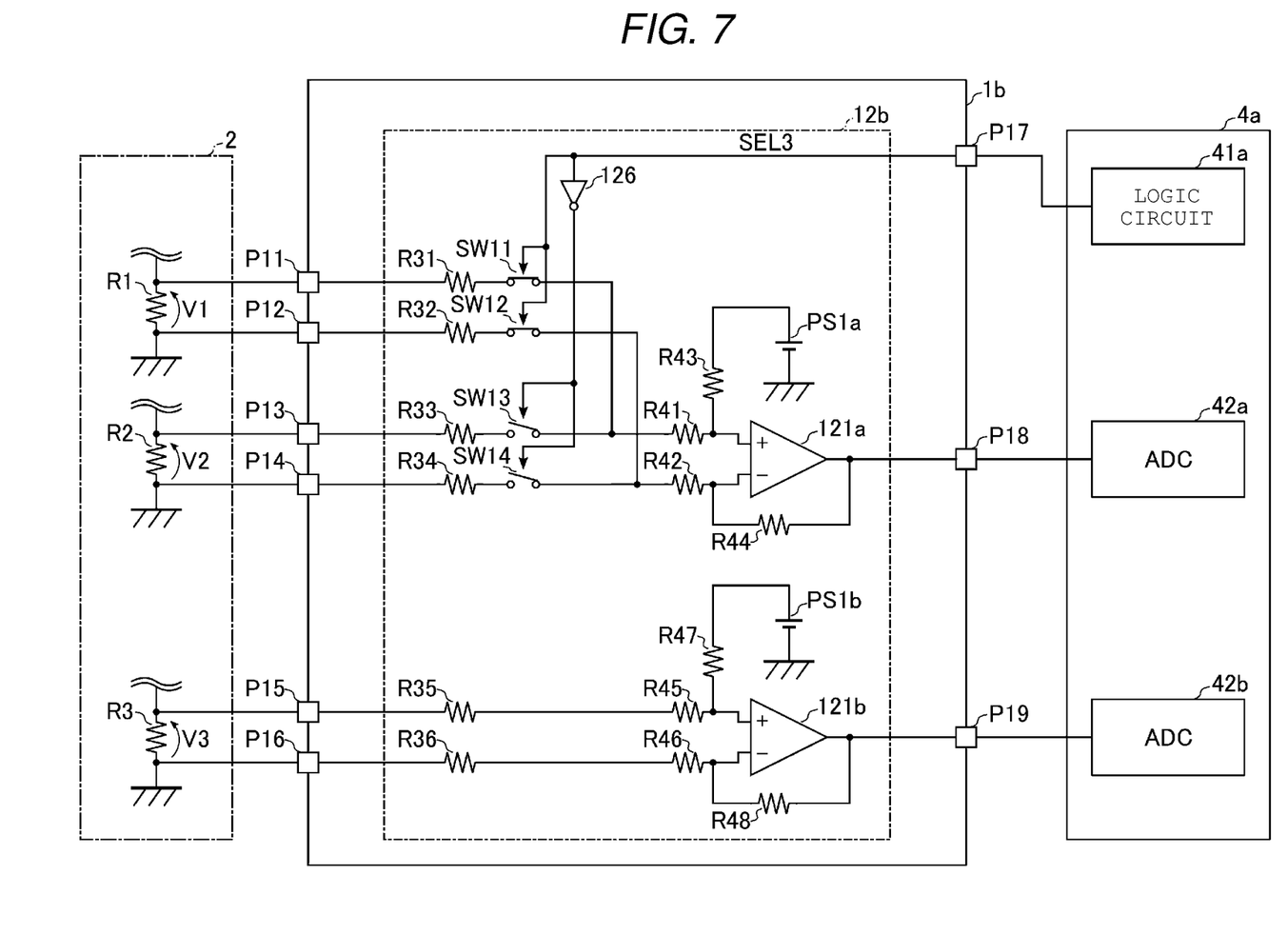
FIG. 7 is a circuit diagram illustrating a current detection circuit of a semiconductor device, a part of a driver circuit, and a microcontroller according to a modification.

In the embodiments described above, a case where the current detection circuit includes the switches SW1 to SW8 is described as an example. The switches may be configured to switch between at least two different voltages. FIG. 7 is a circuit diagram illustrating a current detection circuit of a semiconductor device, a part of a driver circuit, and a microcontroller according to a modification.

A motor drive system according to the modification differs from the motor drive system SYS according to the first embodiment in that the semiconductor device 1 is replaced with a semiconductor device 1b and the microcontroller 4 is replaced with a microcontroller 4a.

The microcontroller 4a is an IC chip. The microcontroller 4a controls the semiconductor device 1b. The microcontroller 4a includes a logic circuit 41a and ADCs 42a and 42b. The logic circuit 41a generates a signal required for controlling the semiconductor device 1b. The logic circuit 41a transmits a control signal to the predriver 11 (not illustrated) and a current detection circuit 12b. Each of the ADCs 42a and 42b measures an input voltage and converts the input voltage into a digital value.

The semiconductor device 1b is an IC chip. The semiconductor device 1b includes the predriver 11 (not illustrated), the current detection circuit 12b, and terminals P11 to P19. The predriver 11 (not illustrated) drives the driver circuit 2 based on a signal of the microcontroller 4a. The current detection circuit 12b detects a current flowing through the driver circuit 2 and outputs a voltage to the microcontroller 4a. The terminals P11 to P19 are configured to electrically connect the inside of the semiconductor device 1b to the outside.

The terminal P11 is connected to the first end of the resistor R1. The terminal P12 is connected to the second end of the resistor R1. The terminal P13 is connected to the first end of the resistor R2. The terminal P14 is connected to the second end of the resistor R2. The terminal P15 is connected to the first end of the resistor R3. The terminal P16 is connected to the second end of the resistor R3. The terminal P17 is connected to the logic circuit 41a. The terminal P18 is connected to the ADC 42a. The terminal P19 is connected to the ADC 42b.

The current detection circuit 12b includes operational amplifiers 121a and 121b, an inverter 126, resistors R31 to R36, resistors R41 to R48, switches SW11 to SW14, and voltage sources PS1a and PS1b.

The operational amplifiers 121a and 121b are operational amplifiers that amplify and output an input signal. Each of the operational amplifiers 121a and 121b is provided with a non-inverting input end, an inverting input end, and an output end. The inverter 126 is an inverter circuit that inverts an input signal and outputs the inverted input signal. The voltage sources PS1a and PS1b are constant voltage sources. A voltage output by each of the voltage sources PS1a and PS1b is the voltage Vref.

A first end of the resistor R31 is connected to the terminal P11. The switch SW11 electrically connects a second end of the resistor R31 and a first end of the resistor R41 when the switch SW11 is in the connected state and electrically insulates them when the switch SW11 is in the non-connected state. A first end of the resistor R32 is connected to the terminal P12. The switch SW12 electrically connects a second end of the resistor R32 and a first end of the resistor R42 when the switch SW12 is in the connected state and electrically insulates them when the switch SW12 is in the non-connected state. A first end of the resistor R33 is connected to the terminal P13. The switch SW13 electrically connects a second end of the resistor R33 and the first end of the resistor R41 when the switch SW13 is in the connected state and electrically insulates them when the switch SW13 is in the non-connected state. A first end of the resistor R34 is connected to the terminal P14. The switch SW14 electrically connects a second end of the resistor R34 and the first end of the resistor R42 when the switch SW14 is in the connected state and electrically insulates them when the switch SW14 is in the non-connected state.

A first end of the resistor R35 is connected to the terminal P15. A second end of the resistor R35 is connected to a first end of the resistor R45. A first end of the resistor R36 is connected to the terminal P16. A second end of the resistor R36 is connected to a first end of the resistor R46.

A second end of the resistor R41 is connected to the non-inverting input end of the operational amplifier 121a. A second end of the resistor R42 is connected to the inverting input end of the operational amplifier 121a. A first end of the resistor R43 is connected to the non-inverting input end of the operational amplifier 121a. A second end of the resistor R43 is connected to a positive output end of the voltage source PS1a. A negative output end of the voltage source PS1a is grounded. A first end of the resistor R44 is connected to the inverting input end of the operational amplifier 121a. A second end of the resistor R44 is connected to the output end of the operational amplifier 121a. The output end of the operational amplifier 121a is connected to the terminal P18.

A second end of the resistor R45 is connected to the non-inverting input end of the operational amplifier 121b. A second end of the resistor R46 is connected to the inverting input end of the operational amplifier 121b. A first end of the resistor R47 is connected to the non-inverting input end of the operational amplifier 121b. A second end of the resistor R47 is connected to a positive output end of the voltage source PS1b. A negative output end of the voltage source PS1b is grounded. A first end of the resistor R48 is connected to the inverting input end of the operational amplifier 121b. A second end of the resistor R48 is connected to the output end of the operational amplifier 121b. The output end of the operational amplifier 121b is connected to the terminal P19.

Each of the switches SW11 and SW12 operates based on a signal SEL3 applied to the terminal P17. The signal SEL3 is a signal having an amount of information of one bit. The inverter 126 inverts the signal SEL3 applied to the terminal P17 and outputs the signal to each of the switches SW13 and SW14. Each of the switches SW13 and SW14 operates based on the signal received from the inverter 126.

In the motor drive system according to the modification, other configurations are the same as those of the motor drive system SYS according to the first embodiment.

The operation of each of the switches SW11 to SW14 will be described.

When the signal SEL3 is at the H level, each of the switches SW11 and SW12 becomes the connected state, and each of the switches SW13 and SW14 becomes the non-connected state. That is, when the signal SEL3 is at the H level, the operational amplifier 121a amplifies and outputs the voltage V1.

When the signal SEL3 is at the L level, each of the switches SW11 and SW12 becomes the non-connected state, and each of the switches SW13 and SW14 becomes the connected state. That is, when the signal SEL3 is at the L level, the operational amplifier 121a amplifies and outputs the voltage V2.

As described above, in the semiconductor device 1b according to the modification, circuits can be switched so that the ADC 42a measures two kinds of voltages.

That is, in the semiconductor device 1b according to the modification, one operational amplifier 121a is shared by two inputs. With this configuration, the circuit size can be reduced and the increase in the chip area can be reduced as compared to when the operational amplifier 121a is provided for each voltage to be measured. That is, the manufacturing cost can be reduced. Further, since the circuit size is reduced, the time required for product testing can be shortened, and the testing cost can be reduced.

Voltage sources having equal output voltages may be combined into one voltage source. For example, in the current detection circuit 12b according to the modification, the voltage source PS1a and the voltage source PS1b have an equal output voltage. Therefore, for example, the voltage source PS1b may be omitted, and the second end of the resistor R47 may be connected to the positive output end of the voltage source PS1a. With this configuration, the operational amplifier 121a and the operational amplifier 121b operate based on the voltage source PS1a. By distributing the voltage from one voltage source to a plurality of operational amplifiers, the cost can be reduced as compared to when a voltage source is provided for each operational amplifier.

As for the resistors of the current detection circuit, a plurality of resistors may be combined into one resistor as long as the gain of the current detection circuit does not change. For example, in the current detection circuit 12b according to the modification, the resistor R35 and the resistor R45 may be combined into one resistor whose resistance value is equal to the sum of the resistance value of the resistor R35 and the resistance value of the resistor R45. Similarly, the resistor R36 and the resistor R46 may be combined into one resistor whose resistance value is equal to the sum of the resistance value of the resistor R36 and the resistance value of the resistor R46. As for the resistors connected in series via the switch, a plurality of resistors may be combined into one resistor as long as the gain of the current detection circuit does not change. For example, in the current detection circuit 12b according to the modification, the resistance value of the resistor R31 may be increased by the resistance value of the resistor R41, the resistance value of the resistor R33 may be increased by the resistance value of the resistor R41, and the resistor R41 may be omitted. Alternatively, if the resistance value of the resistor R31 and the resistance value of the resistor R33 are equal, the resistance value of the resistor R41 may be increased by the resistance value of the resistor R31 and the resistors R31 and R33 may be omitted. Similarly, for the resistors R32, R34, and R42, the resistance value of the resistor R32 may be increased by the resistance value of the resistor R42, the resistance value of the resistor R34 may be increased by the resistance value of the resistor R42, and the resistor R42 may be omitted. Alternatively, if the resistance value of the resistor R32 and the resistance value of the resistor R34 are equal, the resistance value of the resistor R42 may be increased by the resistance value of the resistor R32 and the resistors R32 and R34 may be omitted.

In the embodiments and the modification, the case where the motor 3 is a three-phase AC motor is described as an example. The motor of the system is not limited to the three-phase AC motor. The motor of the system may be, for example, a DC motor, a combination of a DC motor and a single-phase motor, or a plurality of single-phase motors. The drive current generated by the driver circuit 2 is changed to correspond to a connected motor.

In this specification, "connection" indicates that the connection is made electrically, and does not exclude, for example, connection being made via another element in between. Further, the "connection being made electrically" may be made via an insulator as long as the connection can be operated in the same manner as the connection made electrically.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first terminal connected to a first switch;
   a second terminal connected to a second switch;
   a third terminal connected to a third switch;
   a fourth terminal connected to a fourth switch;
   an amplification circuit including a first input end connectable to the first terminal across the first switch and connectable to the third terminal across the third switch, a second input end connectable to the second terminal across the second switch and connectable to the fourth terminal across the fourth switch, and an output end;
   a fifth terminal to which the output end of the amplification circuit is connected; and
   a switching circuit configured to:
      switch the semiconductor device to a first state by putting each of the first and second switches in a connected state and putting each of the third and fourth switches in a non-connected state, wherein in the first state, the first input end is connected to the first terminal and insulated from the third terminal and the second input end is connected to the second terminal and insulated from the fourth terminal, and
      switch the semiconductor device to a second state by putting each of the first and second switches in the non-connected state and putting each of the third and fourth switches in the connected state, wherein in the second state, the first input end is connected to the third terminal and insulated from the first terminal and the second input end is connected to the fourth terminal and insulated from the second terminal.

2. The semiconductor device according to claim 1, further comprising:
   a sixth terminal connected to a fifth switch; and
   a seventh terminal connected to a sixth switch,
   wherein the switching circuit is further configured to:
      switch the semiconductor device to a third state by putting each of the first, second, third, and fourth switches in the non-connected state and putting each of the fifth and sixth switches in the connected state, wherein in the third state, the first input end is connected to the sixth terminal and insulated from the first and third terminals and the second input end is connected to the seventh terminal and insulated from the second and fourth terminals, and
   wherein the switching circuit switches the semiconductor device to both the first and second states, by further putting each of the fifth and sixth switches in the non-connected state, wherein in each of the first and second states, the first input end is insulated from the sixth terminal and the second input end is insulated from the seventh terminal.

3. The semiconductor device according to claim 2, further comprising:
   a seventh switch; and
   an eighth switch, wherein the switching circuit is further configured to;
      switch the semiconductor device to a fourth state by putting each of the first, second, third, fourth, fifth, and sixth switches in the non-connected state and putting each of the seventh and eighth switches in the connected state, wherein in the fourth state, the first input end is grounded and insulated from the first, third, and sixth terminals, and the second input end is grounded and insulated from the second, fourth, and seventh terminals.

4. The semiconductor device according to claim 3, further comprising:
   an eighth terminal to which a first control signal having information of one bit is applied from outside the semiconductor device; and
   a ninth terminal to which a second control signal having information of one bit is applied from outside the semiconductor device, wherein
   the switching circuit is configured to switch a connection state of the first input end and the second input end between the first state, the second state, the third state, and the fourth state, based on the first control signal and the second control signal.

5. The semiconductor device according to claim 1, further comprising:
   a sixth terminal to which a control signal having information of one bit is applied from outside the semiconductor device, wherein
   the switching circuit is configured to switch a connection state of the first input end and the second input end between the first state and the second state based on the control signal.

6. The semiconductor device according to claim 1, wherein
the amplification circuit includes an offset adjustment circuit connected between the first and third terminals and the first input end and between the second and fourth terminals and the second input end.

7. The semiconductor device according to claim 6, wherein
the amplification circuit includes a gain changing circuit.

8. A motor drive system comprising:
a driver circuit including:
a first power supply line,
a second power supply line,
a first transistor having a first end connected to the first power supply line and a second end connected to a first node,
a second transistor having a first end connected to the first node,
a first resistor having a first end connected to a second end of the second transistor and a second end connected to the second power supply line,
a third transistor having a first end connected to the first power supply line and a second end connected to a second node,
a fourth transistor having a first end connected to the second node, and
a second resistor having a first end connected to a second end of the fourth transistor and a second end connected to the second power supply line;
a semiconductor device including:
a predriver configured to control the first transistor, the second transistor, the third transistor, and the fourth transistor,
a first terminal connected to a first switch and the first end of the first resistor,
a second terminal connected to a second switch and the second end of the first resistor is connected,
a third terminal connected to a third switch and the first end of the second resistor,
a fourth terminal connected to a fourth switch and the second end of the second resistor,
an amplification circuit including a first input end connectable to the first terminal across the first switch and connectable to the third terminal across the third switch, a second input end connectable to the second terminal across the second switch and connectable to the fourth terminal across the fourth switch, and an output end,
a fifth terminal to which the output end of the amplification circuit is connected, and
a switching circuit configured to:
switch the semiconductor device to a first state by putting each of the first and second switches in a connected state and putting each of the third and fourth switches in a non-connected state, wherein in the first state, the first input end is connected to the first terminal and insulated from the third terminal and the second input end is connected to the second terminal and insulated from the fourth terminal, and
switch the semiconductor device to a second state by putting each of the first and second switches in the non-connected state and putting each of the third and fourth switches in the connected state, wherein in the second state, the first input end is connected to the third terminal and insulated from the first terminal and the second input end is connected to the fourth terminal and insulated from the second terminal;
a microcontroller that is configured to control the predriver and is connected to the fifth terminal; and
a motor connected to each of the first node and the second node.

9. The motor drive system according to claim 8, wherein the driver circuit further includes;
a fifth transistor having a first end connected to the first power supply line and a second end connected to a third node,
a sixth transistor having a first end connected to the third node, and
a third resistor having a first end connected to a second end of the sixth transistor and a second end connected to the second power supply line,
wherein the semiconductor device further includes;
a sixth terminal connected to a fifth switch and the first end of the third resistor, and
a seventh terminal connected to a sixth switch and the second end of the third resistor,
wherein the switching circuit is further configured to switch the semiconductor device to a third state by putting each of the first, second, third, and fourth switches in the non-connected state and putting each of the fifth and sixth switches in the connected state, wherein in the third state, the first input end is connected to the sixth terminal and insulated from the first and third terminals and the second input end is connected to the seventh terminal and insulated from the second and fourth terminals, and
wherein the switching circuit switches the semiconductor device to both the first and second states, by further putting each of the fifth and sixth switches in the non-connected state, wherein in each of the first and second states, the first input end is insulated from the sixth terminal and the second input end is insulated from the seventh terminal.

10. The motor drive system according to claim 9, wherein the semiconductor device further includes:
a seventh switch, and
an eighth switch, and
wherein the switching circuit is configured to switch the semiconductor device to a fourth state by putting each of the first, second, third, fourth, fifth, and sixth switches in the non-connected state and putting each of the seventh and eighth switches in the connected state, wherein in the fourth state, the first input end is grounded and insulated from the first, third, and sixth terminals, and the second input end is grounded and insulated from the second, fourth, and seventh terminals.

11. The motor drive system according to claim 10, wherein the semiconductor device further includes:
an eighth terminal to which a first control signal having information of one bit is applied from the microcontroller, and
a ninth terminal to which a second control signal having information of one bit is applied from the microcontroller, and
wherein the switching circuit is configured to switch a connection state of the first input end and the second input end between the first state, the second state, the third state, and the fourth state, based on the first control signal and the second control signal.

12. The motor drive system according to claim 8, wherein the semiconductor device further includes a sixth terminal
to which a control signal having information of one bit is applied from the microcontroller, and
the switching circuit is configured to switch a connection state of the first input end and the second input end between the first state and the second state, based on the control signal.

13. The motor drive system according to claim 8, wherein the amplification circuit includes an offset adjustment circuit connected between the first and third terminals and the first input end and between the second and fourth terminals and the second input end.

14. The motor drive system according to claim 13, wherein
the amplification circuit has a gain changing circuit.

15. A method of driving a motor using drive currents output from at least first and second nodes of a driver circuit,
wherein the driver circuit includes:
   a first power supply line,
   a second power supply line,
   a first transistor having a first end connected to the first power supply line and a second end connected to the first node,
   a second transistor having a first end connected to the first node,
   a first resistor having a first end connected to a first terminal and a second end of the second transistor and a second end connected to a second terminal and the second power supply line,
   a third transistor having a first end connected to the first power supply line and a second end connected to the second node,
   a fourth transistor having a first end connected to the second node, and
   a second resistor having a first end connected to a third terminal and a second end of the fourth transistor and a second end connected to a fourth terminal and the second power supply line, and
wherein said method comprises:
   switching a semiconductor device to a first state by putting each of a first switch and a second switch in a connected state and putting each of a third switch and a fourth switch in a non-connected state, wherein in the first state, a first input end of an amplification circuit is connected to the first terminal across the first switch and insulated from the third terminal and a second input end of the amplification circuit is connected to the second terminal across the second switch and insulated from the fourth terminal;
   switching the semiconductor device to a second state by putting each of the first and second switches in the non-connected state and putting each of the third and fourth switches in the connected state, wherein in the second state, the first input end is connected to the third terminal across the third switch and insulated from the first terminal and the second input end is connected to the fourth terminal across the fourth switch and insulated from the second terminal; and
   controlling the first transistor, the second transistor, the third transistor, and the fourth transistor through a predriver according to an output signal of the amplification circuit.

16. The method according to claim 15,
wherein the driver circuit further includes;
   a fifth transistor having a first end connected to the first power supply line and a second end connected to a third node,
   a sixth transistor having a first end connected to the third node, and
   a third resistor having a first end connected to a fifth terminal and a second end of the sixth transistor and a second end connected to a sixth terminal and the second power supply line,
wherein said method further comprises:
   switching the semiconductor device to a third state by putting each of the first, second, third, and fourth switches in the non-connected state and putting each of a fifth switch and a sixth switch in the connected state, wherein in the third state, the first input end is connected to the fifth terminal across the fifth switch and insulated from the first and third terminals and the second input end is connected to the sixth terminal across the sixth switch and insulated from the second and fourth terminals, and
wherein switching the semiconductor device to both the first and second states further includes putting each of the fifth and sixth switches in the non-connected state, and in each of the first and second states, the first input end is insulated from the fifth terminal and the second input end is insulated from the sixth terminal.

17. The method according to claim 16, further comprising:
   switching the semiconductor device to a fourth state by putting each of the first, second, third, fourth, fifth, and sixth switches in the non-connected state and putting each of a seventh switch and an eighth switch in the connected state, wherein
   in the fourth state, the first input end is grounded and insulated from the first, third, and fifth terminals, and the second input end is grounded and insulated from the second, fourth, and sixth terminals.

18. The method according to claim 17, further comprising:
   receiving a first control signal having information of one bit and a second control signal having information of one bit from a microcontroller, wherein
   the switching between the first state, the second state, the third state, and the fourth state, is performed based on the first control signal and the second control signal.

19. The method according to claim 15, further comprising:
   receiving a control signal having information of one bit from a microcontroller, wherein
   the switching between the first state and the second state, is performed based on the control signal.

20. The method according to claim 15, wherein
the motor is driven by a three-phase alternating current.

* * * * *